(12) United States Patent
Rossman et al.

(10) Patent No.: US 9,433,121 B2
(45) Date of Patent: Aug. 30, 2016

(54) CABLE BACKPLANE SYSTEM

(71) Applicant: Tyco Electronics Corporation, Berwyn, PA (US)

(72) Inventors: Jared Evan Rossman, Dover, PA (US); Christopher Ritter, Hummelstown, PA (US)

(73) Assignee: Tyco Electonics Corporation, Berwyn, PA (US)

( * ) Notice: Subject to any disclaimer, the term of this patent is extended or adjusted under 35 U.S.C. 154(b) by 293 days.

(21) Appl. No.: 14/103,321

(22) Filed: Dec. 11, 2013

(65) Prior Publication Data

US 2015/0163951 A1 Jun. 11, 2015

(51) Int. Cl.
| | |
|---|---|
| *G02B 6/00* | (2006.01) |
| *H05K 7/14* | (2006.01) |
| *H02G 3/16* | (2006.01) |
| *H02G 3/08* | (2006.01) |
| *H02G 3/18* | (2006.01) |
| *G06F 1/16* | (2006.01) |
| *H05K 5/00* | (2006.01) |
| *H05K 7/00* | (2006.01) |

(52) U.S. Cl.
CPC .............. *H05K 7/1449* (2013.01); *H02G 3/08* (2013.01); *H02G 3/081* (2013.01); *H02G 3/083* (2013.01); *H02G 3/16* (2013.01); *H02G 3/18* (2013.01)

(58) Field of Classification Search
CPC ........ H02G 3/08; H02G 3/081; H02G 3/083; H02G 3/16; H02G 3/18
USPC ............ 385/135; 361/679.01, 679.02, 679.4; 174/50, 135, 53, 58, 59, 60, 61, 66, 67
See application file for complete search history.

(56) References Cited

U.S. PATENT DOCUMENTS

| | | | | |
|---|---|---|---|---|
| 4,034,871 A | * | 7/1977 | Jorgensen | ............ H05K 7/1422 211/41.17 |
| 7,194,181 B2 | * | 3/2007 | Holmberg | ............ G02B 6/4452 385/134 |
| 2008/0096438 A1 | * | 4/2008 | Clark | ................... H01R 13/518 439/713 |
| 2009/0269019 A1 | * | 10/2009 | Andrus | ................ G02B 6/4452 385/135 |

* cited by examiner

*Primary Examiner* — Hoa C Nguyen
*Assistant Examiner* — Binh Tran

(57) ABSTRACT

A cable backplane system includes cable connectors having cables extending therefrom. Each cable connector has a header holding signal contacts at a mating end of the header configured for mating with a card connector. The cable backplane system includes a cable tray having side walls surrounding a cavity defining a raceway for the cables. The cable tray has a front edge. A plurality of connector bricks are received in the cable tray. The connector bricks each having a header frame comprising end spacers and side spacers defining a header opening receiving a plurality of the cable connectors. The end walls hold the headers of corresponding cable connectors. The side spacers have guide paddles extending from a front of the side spacers forward of the cable connectors.

20 Claims, 8 Drawing Sheets

CABLE BACKPLANE SYSTEM

BACKGROUND OF THE INVENTION

The subject matter herein relates generally to a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. The cable assemblies need to be held in predetermined locations for mating with line and switch cards. Some known cable backplane systems use a cable rack to hold all of the cables and cable connectors of the cable assemblies and a backplane circuit board to precisely locate the cable connectors, guide features and other components for mating with the line and switch cards. However, aligning the many cable connectors with corresponding openings in the backplane circuit board can be difficult during the assembly process as all of the cable connectors need to be properly positioned simultaneously to load the cable rack onto the backplane circuit board.

A need remains for a cable backplane system that may be assembled in an easy and timely manner.

BRIEF DESCRIPTION OF THE INVENTION

In one embodiment, a cable backplane system is provided that includes cable connectors having cables extending therefrom. Each cable connector has a header holding signal contacts at a mating end of the header configured for mating with a card connector. The cable backplane system includes a cable tray having side walls surrounding a cavity defining a raceway for the cables. The cable tray has a front edge. A plurality of connector bricks are received in the cable tray. The connector bricks each having a header frame comprising end spacers and side spacers defining a header opening receiving a plurality of the cable connectors. The end walls hold the headers of corresponding cable connectors. The side spacers have guide paddles extending from a front of the side spacers forward of the cable connectors.

In another embodiment, a cable backplane system is provided that includes a backplane having connector openings extending therethrough and a cable rack coupled to the backplane. The cable rack includes cable connectors having cables extending therefrom. Each cable connector has a header holding signal contacts at a mating end of the header configured for mating with a card connector. A cable tray has side walls surrounding a cavity defining a raceway for the cables. The cable tray has a front edge. A plurality of connector bricks are received in the cable tray. The connector bricks each have a header frame including end spacers and side spacers defining a header opening receiving a plurality of the cable connectors. The end walls hold the headers of corresponding cable connectors. The side spacers have guide paddles extending from a front of the side spacers forward of the cable connectors. The guide paddles are received in corresponding connector openings to guide loading of the headers into the connector openings.

DETAILED DESCRIPTION OF THE INVENTION

Figure 1:
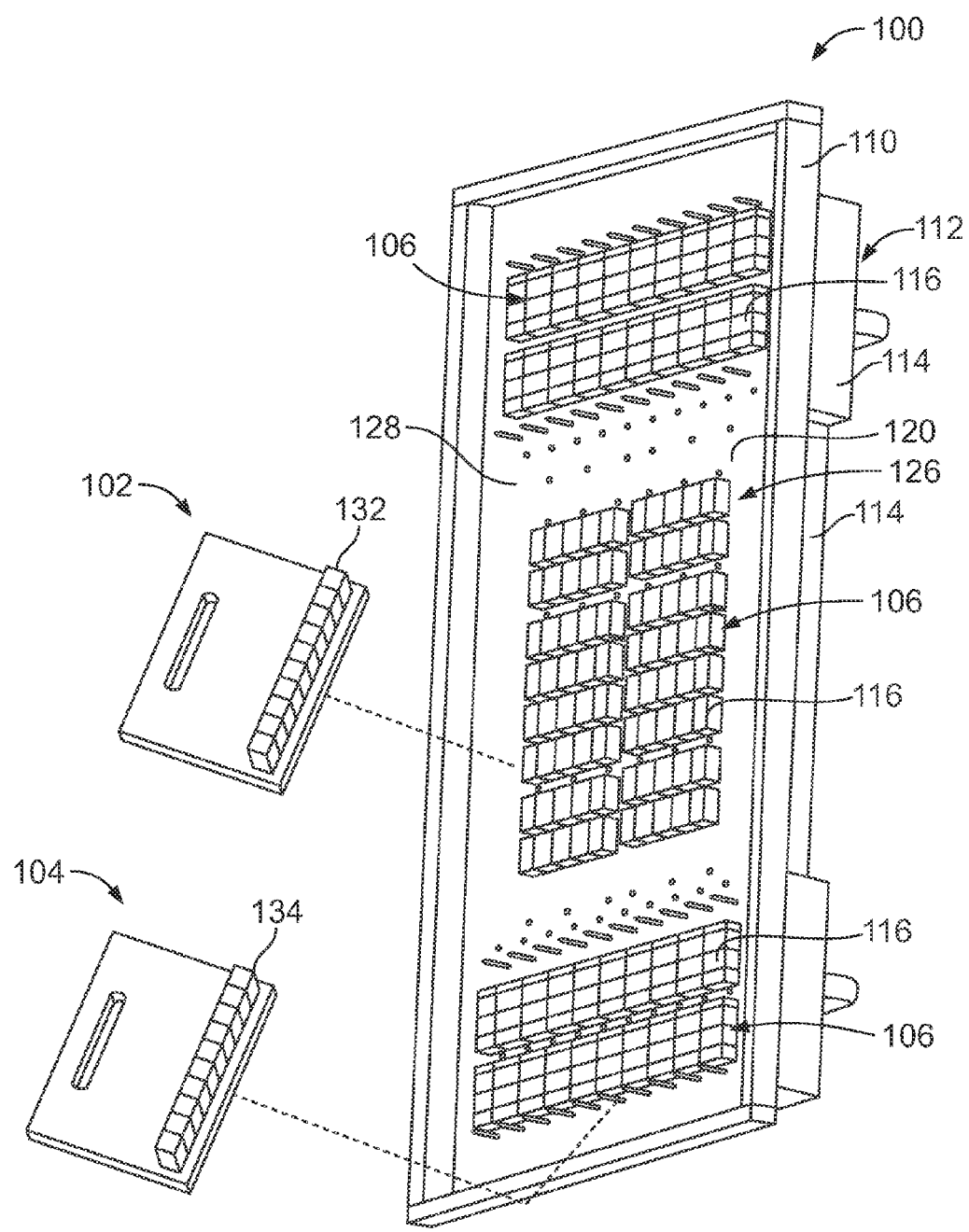
FIG. 1 is a front perspective view of a cable backplane system formed in accordance with an exemplary embodiment.
Figure 2:
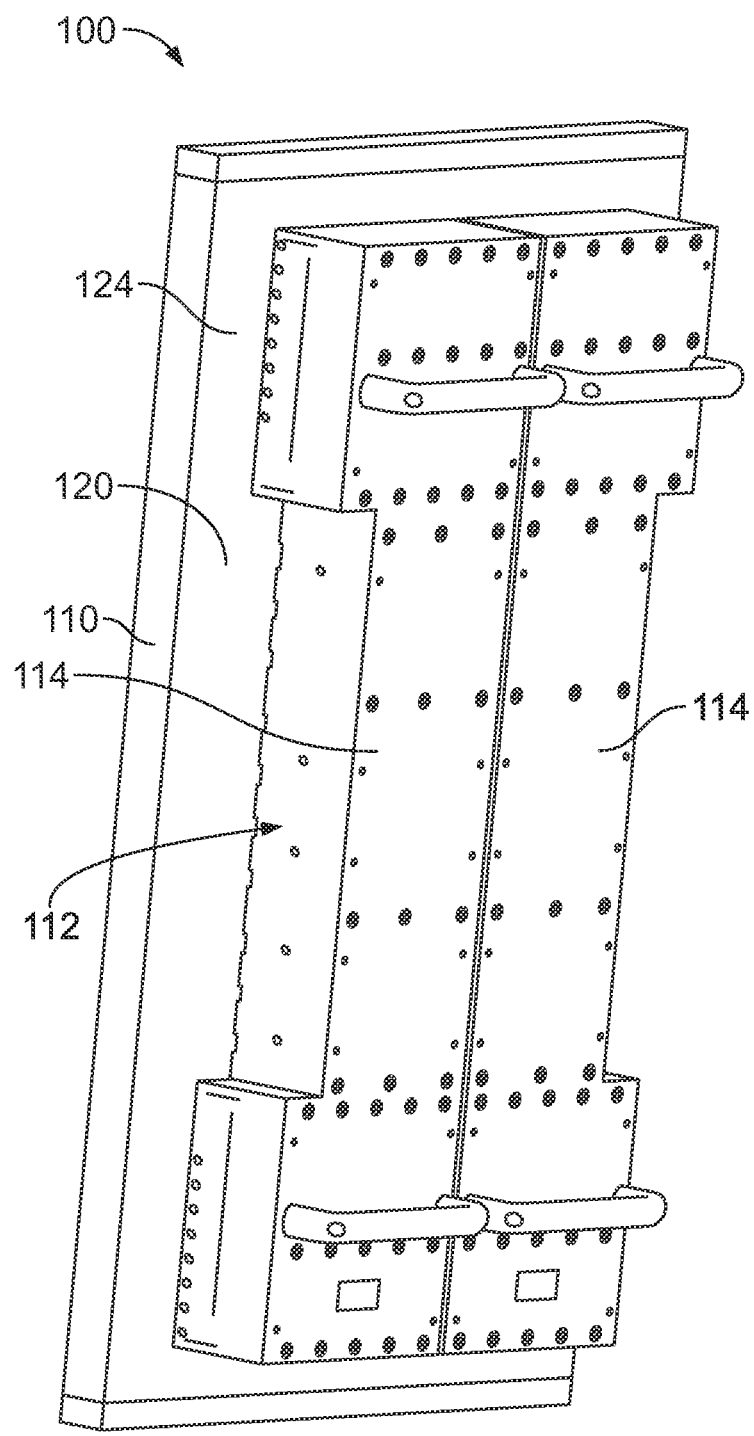
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects with daughtercards, such as line cards 102 and switch cards 104 using cable connector assemblies 106. The cable backplane system 100 may be used to interconnect with other types of connectors and/or cards in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104. The structure manages and organizes the many cables interconnecting the cable connectors 116.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 that supports and/or manages the cables of the cable connector assemblies 106. The cable rack 112 includes a plurality of cable trays 114 that are held together and extend along different portions of the cable backplane system 100. For example, as shown in FIG. 2, two cable trays 114 are provided defining a right half and a left half of the cable rack 112; however greater or fewer cable trays 114 may be provided in alternative embodiments. The cable trays 114 may be generally box-shaped and define raceways for the cables. The cable rack 112 supports a plurality of the cable connectors 116 which form parts of the cable connector assemblies 106.

In an exemplary embodiment, the cable connectors 116 need to be held in proper positions for mating with the line and switch cards 102, 104. For example, the cable connectors 116 need to be held at a predetermined position within a slight tolerance, such as within 1.0 mm of the nominal position. The cable connectors 116 may include lead-in features to guide mating with the line and switch cards 102, 104, but the cable connectors 116 need to be within a certain range or tolerance of the nominal position to ensure that stubbing does not occur during mating. In an exemplary embodiment, the cable rack 112 includes one or more organizer plates 118 (shown in FIG. 3) along a front of the cable trays 114 that align and position the cable connectors 116. Alternatively, a backplane 120 may be used to align and position the cable connectors 116. The organizer plates 118 are used as a cover or lid for the cable trays 114. The organizer plates 118 may be used to position the cable connectors 116 for reception in the backplane 120 in addition to aligning the cable connectors 116 for mating with the line and switch cards 102, 104.

The backplane 120 may be a circuit board and may be manufactured from typical circuit board material, such as FR-4 material. Electrical components, such as power supplies, fans, fixed connectors, and the like may be mechanically and/or electrically connected to the backplane 120. Such electrical components may be electrically connected to traces of the backplane 120. The cable connectors 116 are not electrically connected to the backplane 120, as is typical of conventional backplanes, but rather the cable connectors 116 are interconnected by cables extending between the cable connectors 116. The backplane 120 may be manufactured from other materials in alternative embodiments, such as another dielectric or circuit board material or even a metal material, such as sheet metal, such as in embodiments that do not include the organizer plate 118 and/or embodiments that have no need for mounting other electrical components, such as fixed connectors, power supplies, cooling components, and the like on the backplane 120.

The backplane 120 and cable rack 112, with the cable connector assemblies 106, are coupled together to form the cable backplane system 100. The cable rack 112 is provided along a rear 124 of the backplane 120. The cable connectors 116 extend through connector openings 126 in the backplane 120 and are presented at a front 128 of the backplane 120 for mating with the line and switch cards 102, 104.

The organizer plate 118 and/or backplane 120 hold the cable connectors 116 in precise locations for mating with the line and/or switch cards 102, 104. The organizer plate 118 and/or backplane 120 have tight tolerances to control mating with the line and switch cards 102, 104. The line and switch cards 102, 104 have card connectors 132, 134, respectively, that mate with corresponding cable connectors 116. The cable connectors 116 need to be precisely positioned relative to the backplane 120 for mating with corresponding card connectors 132, 134. Optionally, the organizer plate 118 has tighter tolerances than the backplane 120 and is thus used to position the cable connectors 116 for mating with the card connectors 132, 134.

Figure 3:
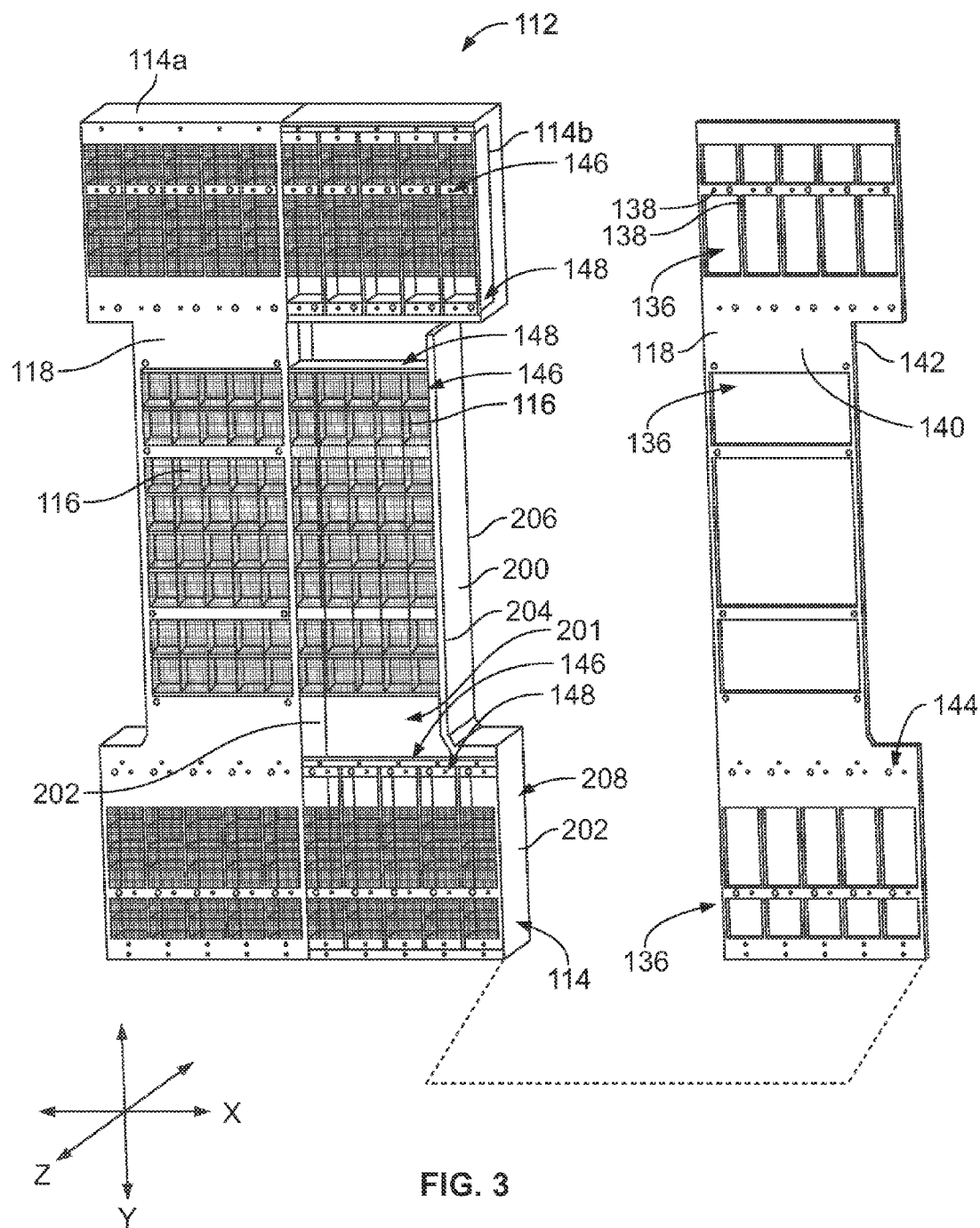
FIG. 3 is a partial assembled view of a cable rack of the cable backplane system showing an organizer plate poised for mounting to a cable tray.

FIG. 3 is a partial assembled view of the cable rack 112 showing one of the organizer plates 118 poised for mounting to the cable tray 114 over the cable connectors 116. The organizer plate 118 includes connector channels 136 that receive the cable connectors 116 and/or portions of the cable trays 114. The connector channels 136 may be single openings that receive single cable connectors 116, or may be large openings that receive many cable connectors 116. As noted above, in alternative embodiments, the cable rack 112 may be provided without the organizer plates 118 and mounted directly to the backplane 120 (shown in FIGS. 1 and 2) without the organizer plates 118 positioned therebetween.

In an exemplary embodiment, the organizer plate 118 is a sheet metal plate having the connector channels 136 stamped out of the sheet metal plate in precise locations. The organizer plate 118 may be manufactured from other materials in alternative embodiments, such as dielectric materials including plastic material, FR-4 material, and the like.

The organizer plate 118 includes longitudinal strips 138 of plate material between the connector channels 136. The tolerances of the sizing and spacing of the connector channels 136 and strips 138 may be tightly controlled to control the relative positions of the cable connectors 116.

The organizer plate 118 includes a front 140 and a rear 142. The rear 142 is mounted to the front of the cable tray 114. The organizer plate 118 may be secured to the cable tray 114 by fasteners, such as threaded fasteners. For example, the organizer plate 118 includes holes 144 therethrough that receive fasteners or other components used to assemble the cable rack 112. The holes 144 may define guide holes that receive guide features such as guide paddles or guide pins.

The cable trays 114 are coupled together into an I-shaped configuration having a first cable tray 114a defining a left half of the cable rack 112 (when viewed from the front) and a second cable tray 114b defining a right half of the cable rack 112. The cable rack 112 may have other shapes in alternative embodiments. In an exemplary embodiment, the cable rack 112 includes header frames 146 used to hold multiple cable connectors 116 together as a unit that can be loaded into the cable tray 114. The header frames 146 position the cable connectors 116 relative to one another to make routing and organizing of the cables and cable connectors 116 into the cable trays 114 easier for the assembler. The header frames 146 and corresponding cable connectors 116 define connector bricks 148 that are loaded into the cable trays 114 as units. The connector bricks 148 may be oriented vertically, horizontally or at other orientations.

Each cable tray 114 includes a frame 200 surrounding a cavity 201 that defines a raceway through which cables 152 (shown in FIG. 4) are routed. The raceways may be open to one another to allow the cables 152 to be routed from one cable tray 114 into another cable tray 114. The frame 200 includes side walls 202 extending between a front edge 204 and a rear 206 of the cable tray 114. A back wall 208 covers the raceway at the rear 206. The frame 200 is open at the front edge 204 between the side walls 202. The organizer plate 118 is coupled to the front edge 204 to cover or close the cable tray 114. The header frames 146, while holding the plurality of cable connectors 116, are loaded into the cable tray(s) 114, such as through the front. Once the header frames 146 are positioned in the corresponding tray 114, the cable connectors 116 are positioned at or forward of the front edge 204 for loading into the connector channels 136 of the organizer plate 118.

In an exemplary embodiment, the side walls 202 and back wall 208 are sheet metal pieces that are stamped, formed and coupled together, such as using fasteners or other connecting means. The sheet metal may be sufficiently thin to allow the frame 200 to have some flexibility for moving, twisting or otherwise manipulating the cable trays 114 into position relative to the organizer plate 118 to position the cable connectors 116 in the connector channels 136 in the organizer plate 118. Optionally, the cable trays 114a and 114b may be connected to each other with some freedom of movement or float in the connection to allow the cable trays 114a, 114b to move relative to one another to properly align the cable connectors 116 with the connector channels 136 in the organizer plate 118.

In an exemplary embodiment, the cable connectors 116 are movable relative to the header frames 146 to allow the cable connectors 116 to align with the corresponding connector channels 136 during assembly of the cable rack 112 and organizer plate 118 and/or connector openings 126 during mounting of the cable rack 112 to the backplane 120 and/or the card connectors 132, 134 (shown in FIG. 1) during mating therewith. For example, the header frames 146 may allow a limited amount of movement or float in mutually perpendicular X, Y and/or Z directions to allow fine alignment of the cable connectors 116 with the connector channels 136. In an exemplary embodiment, the cable connectors 116 are configured to float within the connector channels 136 relative to the header frames 146 and/or cable trays 114 to obtain a nominal position for aligning to and mating with the corresponding card connectors 132, 134.

Figure 4:
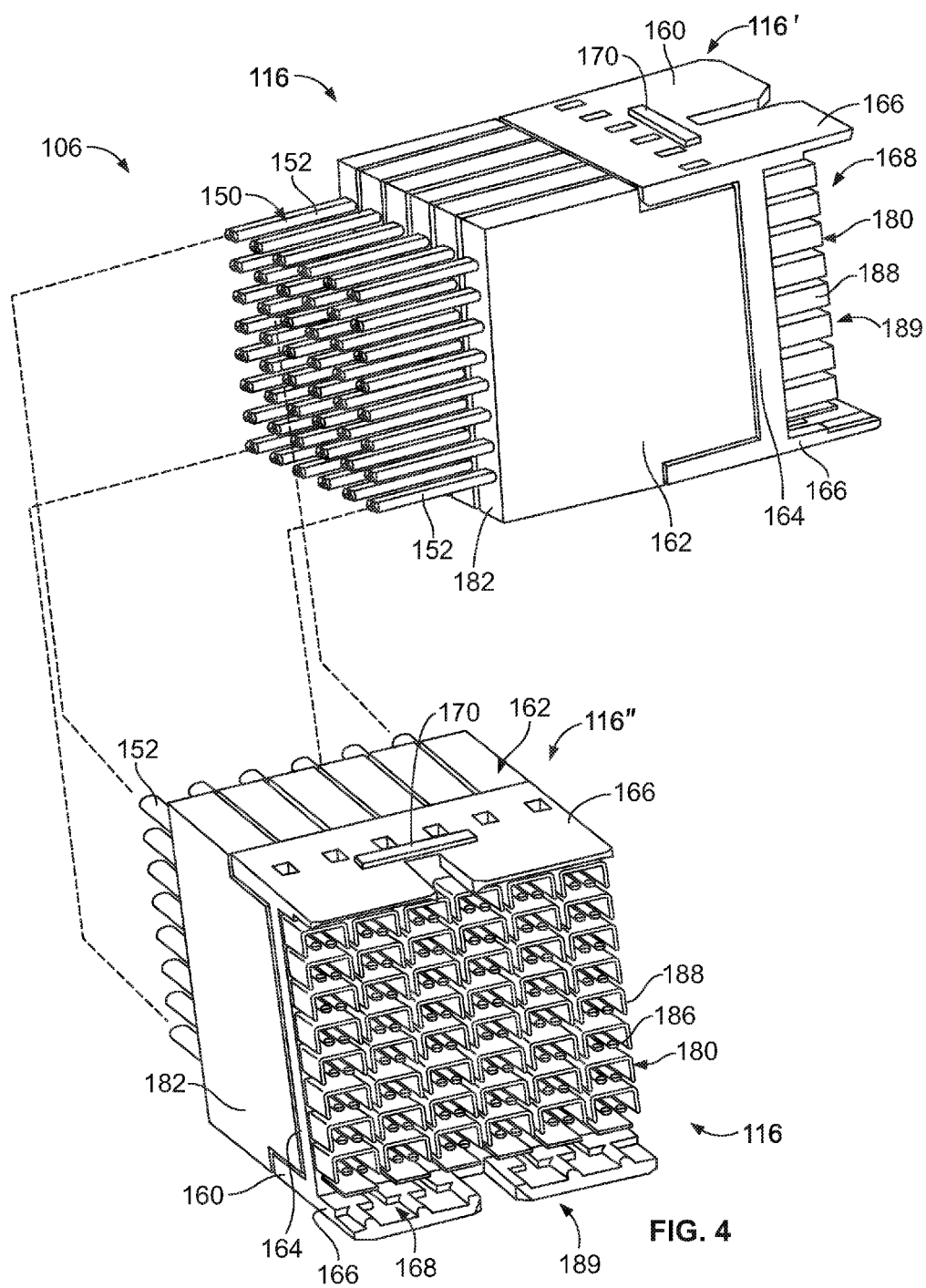
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header 160 holding a plurality of contact modules 162. The header 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header 160 has lugs 170 extending outward from the shroud walls 166. The lugs 170 are used to locate the cable connector 116 with respect to the corresponding cable tray 114 (shown in FIGS. 2 and 3).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference. The cable assemblies 180 may be provided with greater or fewer signal contacts 186 in alternative embodiments. The cable assemblies 180 may be provided without the ground shields 188 in alternative embodiments. The cable assemblies 180 may be provided with different shaped ground shields 188 in alternative embodiments.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180. The contact modules 162 may be provided without the support bodies 182 in alternative embodiments.

Multiple contact modules 162 are loaded into the header 160. The header 160 holds the contact modules 162 in parallel such that the cable assemblies 180 are aligned in parallel columns. Any number of contact modules 162 may be held by the header 160 depending on the particular application. When the contact modules 162 are stacked in the header 160, the cable assemblies 180 may also be aligned in rows. The header 160 holds the signal contacts 186 at a mating end 189 of the header 160 configured for mating with a mating connector, such as a card connector.

Figure 5:
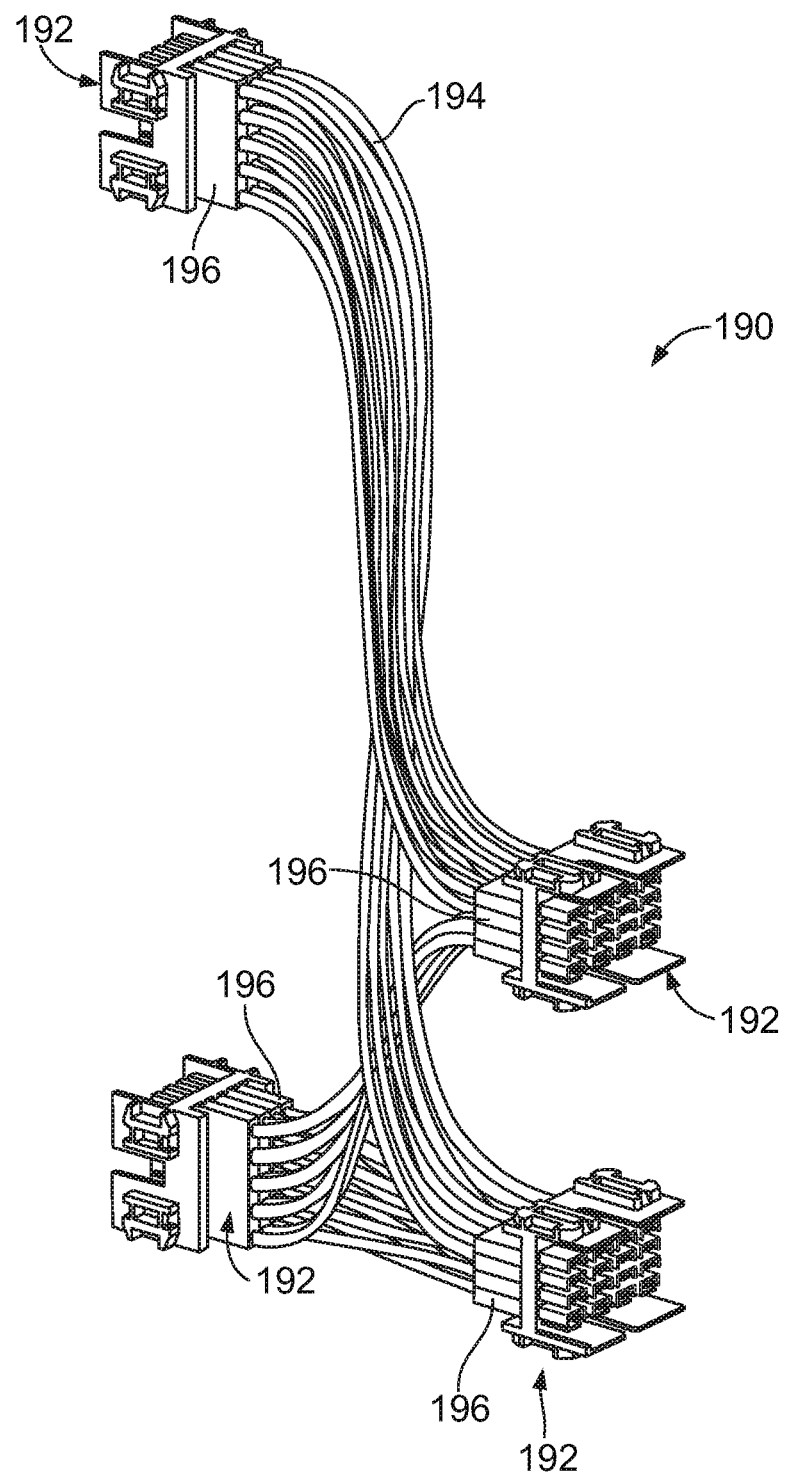
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
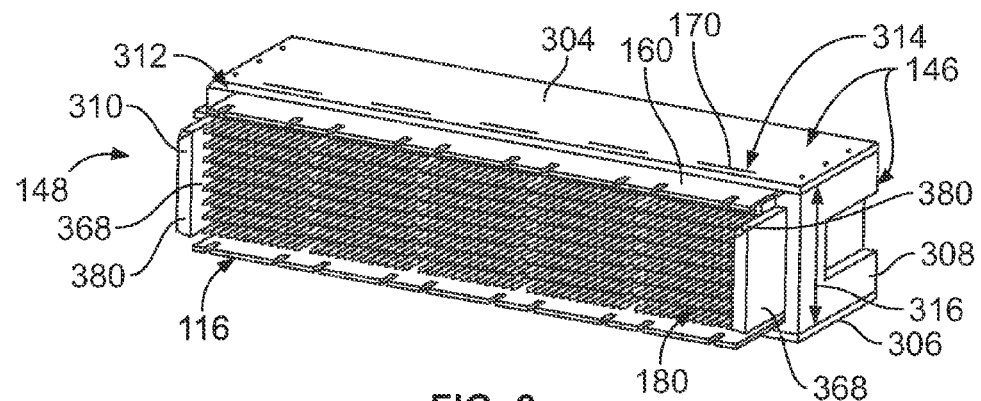
FIG. 6 is a front perspective view of a connector brick for the cable rack and formed in accordance with an exemplary embodiment.

FIG. 6 is a front perspective view of a connector brick 148 formed in accordance with an exemplary embodiment. The connector brick 148 includes the header frame 146 that holds the cable connectors 116. In the illustrated embodiment, the header frame 146 include a pair of end spacers 304, 306 and a pair of side spacers 308, 310 extending between the end spacers 304, 306. The side spacers 308, 310 are blocks positioned between the end spacers 304, 306 to control the spacing between the end spacers 304, 306. The end spacers 304, 306 may be secured to the side spacers 308, 310, such as by threaded fasteners.

Figure 7:
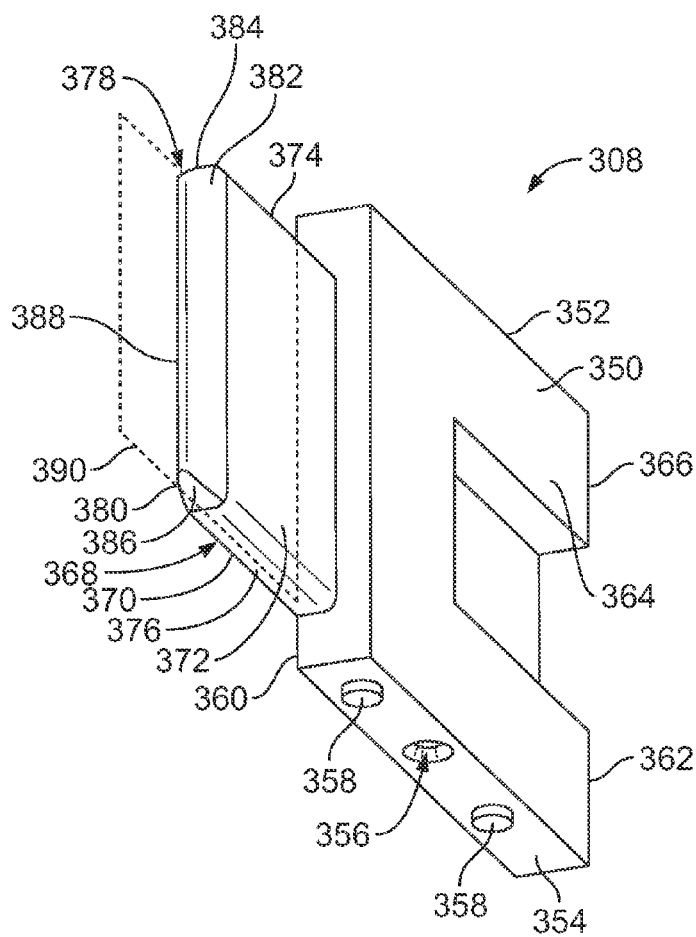
FIG. 7 is a front perspective view of a side spacer of the connector brick.

FIG. 7 is a front perspective view of the side spacer 308. The side spacer 308 includes a base 350 extending between first and second ends 352, 354 configured to face corresponding end spacers 304, 306 (shown in FIG. 6). The ends 352, 354 have bores 356 that receive fasteners that secure the end spacers 304, 306 to the side spacer 308. The bores 356 may be threaded. The ends 352, 354 have posts 358 extending therefrom. The posts 358 may be used to position and/or secure the side spacer 308 to the end spacers 304, 306.

The side spacer 308 includes an inner side 360 and an outer side 362 extending between the first and second ends 352, 354. The inner side 360 is configured to face the cable connectors 116 (shown in FIG. 6) and the outer side 362 faces away from the cable connectors 116.

The base 350 of the side spacer 308 includes a front 364 and a rear 366 opposite the front 364. A guide feature 368 extends from the front 364, which in the illustrated embodiment is a guide paddle and may be referred to hereinafter as guide paddle 368. In an exemplary embodiment, the guide paddle 368 is generally rectangular in shape having planar inner and outer sides 370, 372 that extend between opposite upper and lower ends 374, 376. The inner side 370 is configured to face the cable connectors 116 and the outer side 362 faces away from the cable connectors 116. Optionally, the inner side 370 may be generally coplanar with the inner side 360 of the base 350. The guide feature 368 may have a different shape in alternative embodiments.

The sides 370, 372 and ends 374, 376 extend to a front edge 378. In an exemplary embodiment, the front edge 378 is chamfered. For example, the inner side 370 has an inner lead-in 380; the outer side 372 has an outer lead-in 382; the upper end 374 has an upper lead-in 384; and the lower end 376 has a lower lead-in 386. The lead-ins 380, 382, 384, 386 at the front edge 378 extend to a tip 388. Optionally, the tip 388 may be offset with respect to a central midplane 390 of the guide paddle 368, such as closer to the inner side 370. As such, the outer lead-in 382 may have a greater width defined between the tip and a plane defined by the outer side 372, as compared to the embodiment in which the tip 388 is centered along the central midplane 390. Optionally, the guide paddle 368 may not have any inner lead-in 380, but rather, the tip 388 may be positioned along the inner side 370.

The inner and outer lead-ins 380, 382 may guide side-to-side, for example horizontal, lead-in (X direction) of the guide paddle 368 into the corresponding connector channels 136 of the organizer plate 118 (both shown in FIG. 3) and/or the connector openings 126 of the backplane 120 (both shown in FIG. 1). The upper and lower lead-ins 384, 386 may guide top-to-bottom, for example vertical, lead-in (Y direction) of the guide paddle 368 into the corresponding connector channels 136 of the organizer plate 118 and/or the connector openings 126 of the backplane 120.

Returning to FIG. 6, a header opening 312 is defined between the end spacers 304, 306 and the side spacers 308, 310. The headers 160 of the cable connectors 116 are received in the header opening 312. The header opening 312 may be sized to receive any number of headers 160, such as by lengthening or shortening the end spacers 304, 306. Optionally, the header frame 146 is sized to align the headers 160 in a single row within the header opening 312. For example, the side spacers 308, 310 control the spacing between the end spacers 304, 306 and define a width 316 of the header opening 312 between the end spacers 304, 306. Optionally, the width 316 may be approximately equal to a single header width, such as slightly wider than the header width to allow a limited amount of floating movement between the end spacers 304, 306.

In an exemplary embodiment, the end spacers 304, 306 are generally planar plates having a rectangular shape; however, other shapes are possible in alternative embodiments. The end spacers 304, 306 include elongated slots 314 that receive corresponding lugs 170 (shown in FIG. 4) of the headers 160. The slots 314 may be oversized relative to the lugs 170 to allow a limited amount of floating movement of the headers 160 relative to the header frame 146. As such, when the connector bricks 148 are held in the cable trays 114 (shown in FIG. 3), the headers 160 are movable relative to the cable trays 114, such as for alignment with the connector channels 136 of the organizer plate 118 (both shown in FIG. 3), the connector openings 126 of the backplane 120 (both shown in FIG. 1), and/or the mating connectors 132, 134 of the line and switch cards 102, 104 (all shown in FIG. 1).

The guide paddles 368 extend along the sides of the headers 160 and cable assemblies 180 of the cable connectors 116. The guide paddles 368 protect the cable assemblies 180. The guide paddles 368 are used to guide loading of the connector brick 148 into the corresponding connector channel 136 of the organizer plate 118 (both shown in FIG. 3) and/or the connector openings 126 of the backplane 120 (both shown in FIG. 1). The guide paddles 368 are used to guide mating of the card connectors 132 and/or 134 (both shown in FIG. 1) with the connector brick 148. For example, the inner lead-ins 380 may direct the card connectors 132, 134 into alignment with the cable connectors 116.

Figure 8:
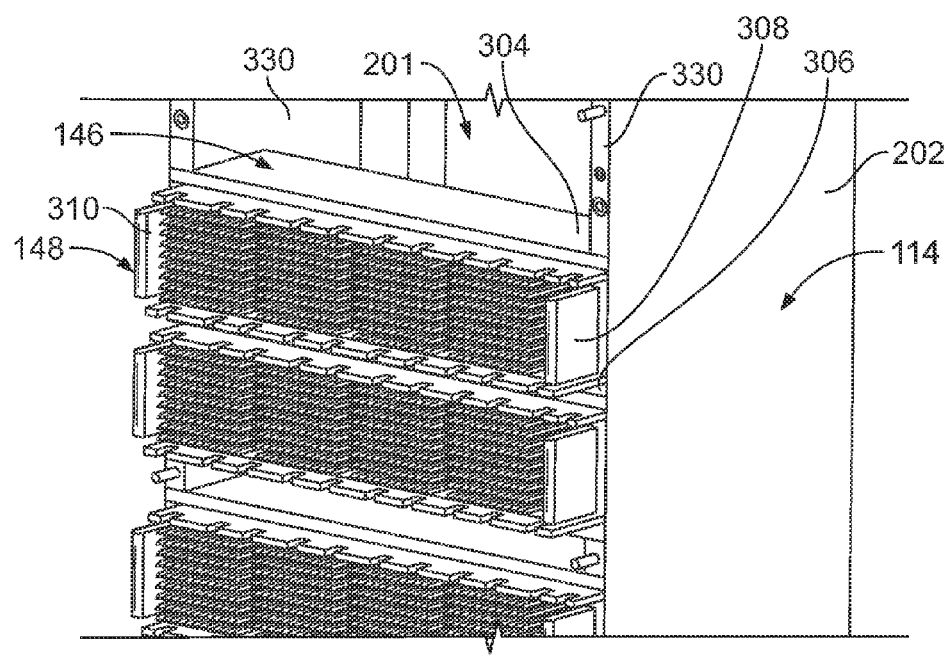
FIG. 8 illustrates the connector brick loaded in the cable tray 114.

FIG. 8 illustrates the connector bricks 148 loaded in the cable tray 114. In an exemplary embodiment, the header frames 146 include side frames 330 that support the connector bricks 148. The side frames 330 are secured to the side walls 202 of the cable tray 114. The side spacers 308, 310 and/or the end spacers 304, 306 may be secured to the side frames 330, such as by threaded fasteners (not shown). The side frames 330 position the connector bricks 148 relative to one another within the cable tray 114. Optionally, the connector bricks 148 may be pre-assembled to the side frames 330 prior to loading the side frames 330 into the cavity 201 of the cable tray 114. In an alternative embodiment, rather than using the side frames 330, the connector bricks 148 may be secured directly to the side walls 202 of the cable tray 114.

Optionally, the connector bricks 148 may be positioned immediately adjacent one another. Alternatively, the connector bricks 148 may be spaced apart from one another by a predetermined spacing, such as to accommodate parts of the organizer plate 118 (shown in FIG. 3), the backplane 120 (shown in FIG. 1) and/or the chassis 110 (shown in FIG. 1).

Figure 9:
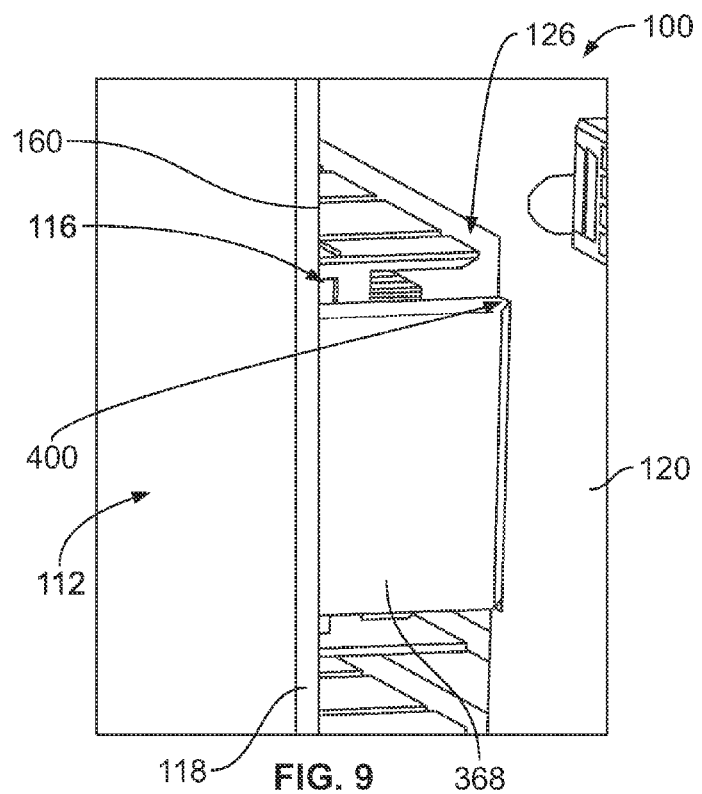
FIG. 9 illustrates a portion of the cable backplane system showing a cable rack thereof posed for mounting to a backplane.

FIG. 9 illustrates a portion of the cable backplane system 100 showing the cable rack 112 poised for mounting to the backplane 120. One of the guide paddles 368 is illustrated extending forward from the cable rack 112. The guide paddle 368 is used for locating the cable rack 112 relative to the backplane 120. The guide paddle 368 may be used for locating the cable rack 112 relative to the organizer plate 118 (shown in FIG. 3) in a similar manner as described with respect to the backplane 120.

The guide paddle 368 is received in the corresponding connector opening 126 of the backplane 120 and is used to vertically and horizontally locate the connector brick 148 (shown in FIG. 6) with the connector opening 126. The guide paddle 368 locates the headers 160 of the cable connectors 116 with the connector opening 126 to prevent stubbing of the headers 160 with the backplane 120 as the headers 160 are loaded into the connector openings 126.

In an exemplary embodiment, the connector opening 126 includes a notch 400 that receives the corresponding guide paddle 368. The notch 400 is sized and shaped to receive the guide paddle 368. Optionally, the notch 400 may be slightly larger than the guide paddle 368 to ensure that the guide paddle 368 is able to be loaded therein with little or no interference or friction. The tolerance band around the guide paddle 368 may be small to ensure proper positioning of the guide paddle 368, and thus the connector brick 148, relative to the connector opening 126.

Figure 10:
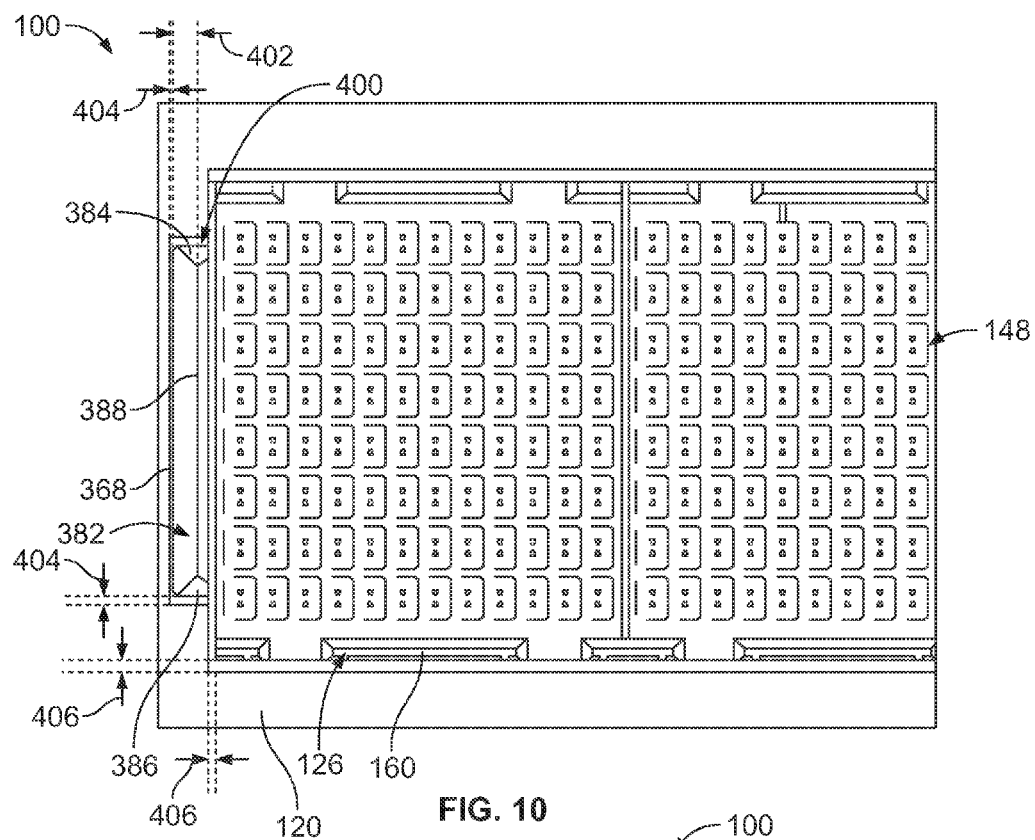
FIG. 10 illustrates a portion of the cable backplane system showing a portion of the connector brick received in the backplane.

FIG. 10 illustrates a portion of the cable backplane system 100 showing a portion of the connector brick 148 received in the connector opening 126 of the backplane 120. One of the guide paddles 368 is illustrated loaded into the corresponding notch 400. The guide paddle 368 is used for locating the cable rack 112 (FIGS. 2 and 3) relative to the backplane 120. The guide paddle 368 may be used for locating the cable rack 112 relative to the organizer plate 118 (shown in FIG. 3) in a similar manner as described with respect to the backplane 120.

The guide paddle 368 is received in the corresponding notch 400 of the connector opening 126 to vertically and horizontally locate the connector brick 148 with the connector opening 126. The upper and lower lead-ins 384, 386 may guide top-to-bottom, for example vertical, lead-in (Y direction) of the guide paddle 368 into the connector opening 126 of the backplane 120. The outer lead-in 382 may locate the connector brick 148 side-to-side (X direction) within the connector opening 126 and, in conjunction with the guide paddle (not shown) on the opposite side of the connector brick 148, may substantially center the connector brick 148 within the connector opening 126. In an exemplary embodiment, the outer lead-in 382 is angled to provide a lead-in dimension 402 that is greater than half the over-all width of the guide paddle 368. For example, because the tip 388 is off-set inward of the central midplane of the guide paddle 368, the lead-in dimension 402 may be greater than half of the over-all width of the guide paddle 368, which is in contrast to, for example, cylindrical pins, which have lead-ins that are less than half of the diameter of the pins. The guide paddle 368 can provide a desired amount of lead-in with a narrower over-all width, which may reduce the overall width of the connector brick 148. Additionally, guide pins typically need to be received in designated guide holes through the backplane 120, which need to be shifted outward, outside of the connector opening 126, thus increasing the overall width of the connector brick 148 as compared to the design of the guide paddle 368, which is received in the same connector opening 126 as the cable connectors 126.

In an exemplary embodiment, the notch 400 is sized to have a predetermined paddle clearance gap 404 between the backplane 120 and the guide paddle 368. The paddle clearance gap 404 may have a non-uniform width, such as along the top, bottom and/or outer side of the guide paddle 368. Additionally, the paddle clearance gap 404 for one guide paddle 368 may be different than for the other guide paddle 368 at the opposite end of the connector brick 148 (for example, the connector brick may be shifted toward one side or the other or may be rotated within the connector opening 126). The connector opening 126 may be sized to have a predetermined header clearance gap 406 between the headers 160 and the edge of the connector opening 126. The header clearance gap 406 may have a non-uniform width, such as along the top, bottom and/or outer sides of the header 160. In an exemplary embodiment, the paddle clearance gap 404 is smaller (for example, has a tighter tolerance) than the header clearance gap 406. As such, the guide paddles 368 ensure that the headers 160 do not interfere with and/or stub against the backplane 120 when loaded into the connector opening 126. For example, because the header clearance gap 406 is larger than the paddle clearance gap 404, even when the connector brick 148 is shifted as far left as possible (for example, the outer lead-in 382 of the left guide paddle 368 engages the backplane 120 as the guide paddle 368 is loaded into the notch 400) and there is zero paddle clearance gap 404, a positive header clearance gap 406 still exists and the headers 160 pass through the connector opening 126 without any stubbing.

Figure 11:
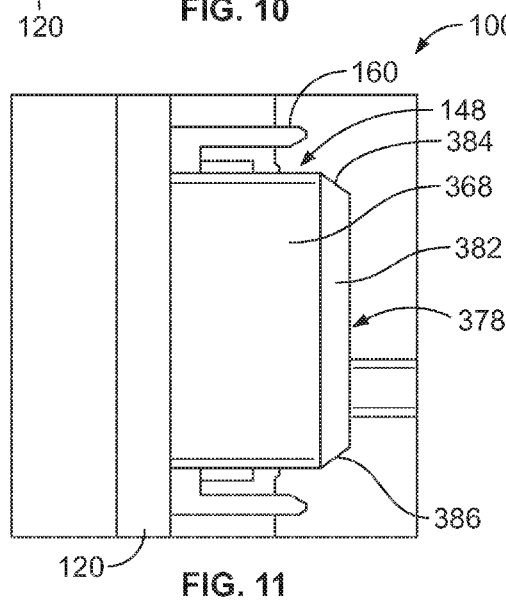
FIG. 11 is a side view of a portion of the cable backplane system.

FIG. 11 is a side view of a portion of the cable backplane system 100 showing the guide paddle 368 and corresponding header 160 of one of the connector bricks 148 received through the backplane 120. FIG. 11 illustrates that the guide paddle 368 extends forward of the header 160, and thus the guide paddle 368 passes through the connector opening 126 (shown in FIG. 10) prior to the header 160 passing through the connector opening 126. The guidance provided by the lead-ins 382, 384, 386 at the front edge 378 is performed prior to the headers 160 entering the connector openings 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35

U.S.C. §112, sixth paragraph, unless and until such claim limitations expressly use the phrase "means for" followed by a statement of function void of further structure.

What is claimed is:

1. A cable backplane system comprising:
cable connectors having cables extending therefrom, each cable connector having a header holding signal contacts at a mating end of the header, the mating end being configured to be received in a corresponding connector opening in a backplane;
a cable tray having side walls surrounding a cavity defining a raceway for the cables, the cable tray having a front edge; and
a plurality of connector bricks received in the cable tray, the connector bricks each having a header frame comprising end spacers and side spacers defining a header opening receiving a plurality of the cable connectors between the side spacers with the mating ends of the cable connectors being forward facing, the end spacers holding the headers of corresponding cable connectors, the side spacers having guide paddles each configured to be loaded into the backplane to guide assembly of the connector brick to the backplane, the guide paddles extending from a front of the side spacers forward of the mating ends of the cable connectors for locating the plurality of cable connectors relative to the corresponding connector opening in the backplane.

2. The cable backplane system of claim 1, wherein the side spacers are separate and discrete from the end spacers and independently coupled to the end spacers to define the header frame, the side spacers being positioned between the end spacers and define a width of the header opening between the end spacers.

3. The cable backplane system of claim 1, wherein the guide paddles have planar sides extending to a front edge, the front edge being chamfered and configured to be loaded into the backplane to guide assembly of the connector brick to the backplane.

4. The cable backplane system of claim 1, wherein the guide paddles each include an inner side facing the cable connectors and an outer side facing away from the cable connectors, the inner and outer sides extending to a front edge, the front edge being chamfered having a lead-in at the inner side and a lead-in at the outer side, the outer side having a greater lead-in than the inner side.

5. The cable backplane system of claim 1, wherein the guide paddles have planar sides extending to a front edge and ends between the sides, the sides being chamfered at the front edge, the ends being chamfered at the front edge.

6. The cable backplane system of claim 1, wherein the guide paddles have planar sides extending to a front edge, the front edge having a tip, the tip being offset with respect to a central midplane between the planar sides.

7. The cable backplane system of claim 1, wherein the side spacers are secured to the end spacers using fasteners.

8. The cable backplane system of claim 1, wherein the end spacers include slots, the headers comprising lugs received in corresponding slots, the slots being oversized relative to the lugs to allow a limited amount of floating movement of the headers relative to the end spacers.

9. The cable backplane system of claim 1, further comprising a backplane having connector openings, the guide paddles being received in the connector openings to position the connector bricks relative to the backplane.

10. The cable backplane system of claim 9, wherein the connector openings comprise notches receiving corresponding guide paddles, the notches being sized to have a predetermined paddle clearance gap between the backplane and the guide paddle, the connector opening being sized to have a predetermined header clearance gap between the connector opening and the headers of the cable connectors, the paddle clearance gap being smaller than the header clearance gap.

11. The cable backplane system of claim 1, further comprising side frames coupled to the side walls of the cable tray, the header frame being secured to the side frames to secure the connector bricks in the cable tray.

12. The cable backplane system of claim 11, wherein multiple connector bricks are coupled to the side frames prior to loading the side frames and corresponding connector bricks into the cable tray as a unit.

13. A cable backplane system comprising:
a backplane having connector openings extending therethrough; and
a cable rack coupled to the backplane, the cable rack comprising:
cable connectors having cables extending therefrom, each cable connector having a header holding signal contacts at a mating end of the header;
a cable tray having side walls surrounding a cavity defining a raceway for the cables, the cable tray having a front edge; and
a plurality of connector bricks received in the cable tray, the connector bricks each having a header frame comprising end spacers and side spacers defining a header opening receiving a plurality of the cable connectors, the end spacers holding the headers of corresponding cable connectors, the side spacers having guide paddles extending from a front of the side spacers forward of the cable connectors;
wherein the guide paddles are received in corresponding connector openings to guide loading of the headers into the connector openings.

14. The cable backplane system of claim 13, wherein the side spacers are positioned between the end spacers and define a width of the header opening between the end spacers.

15. The cable backplane system of claim 13, wherein the guide paddles have planar sides extending to a front edge, the front edge being chamfered.

16. The cable backplane system of claim 13, wherein the guide paddles each include an inner side facing the cable connectors and an outer side facing away from the cable connectors, the inner and outer sides extending to a front edge, the front edge being chamfered having a lead-in at the inner side and a lead-in at the outer side, the outer side having a greater lead-in than the inner side.

17. The cable backplane system of claim 13, wherein the guide paddles have planar sides extending to a front edge and ends between the sides, the sides being chamfered at the front edge, the ends being chamfered at the front edge.

18. The cable backplane system of claim 13, wherein the guide paddles have planar sides extending to a front edge, the front edge having a tip, the tip being offset with respect to a central midplane between the planar sides.

19. The cable backplane system of claim 13, wherein the end spacers include slots, the headers comprising lugs received in corresponding slots, the slots being oversized relative to the lugs to allow a limited amount of floating movement of the headers relative to the end spacers.

20. The cable backplane system of claim 13, wherein the connector openings comprise notches receiving corresponding guide paddles, the notches being sized to have a predetermined paddle clearance gap between the backplane and the guide paddle, the connector opening being sized to have a predetermined header clearance gap between the connector opening and the headers of the cable connectors, the paddle clearance gap being smaller than the header clearance gap.

* * * * *